(12) United States Patent
Eriksson et al.

(10) Patent No.: US 9,979,106 B2
(45) Date of Patent: May 22, 2018

(54) MODULAR FIELD DEVICE CONNECTION UNIT

(71) Applicant: ABB Schweiz AG, Baden (CH)

(72) Inventors: Rolf Eriksson, Vaesteras (SE); Erik Hammarstrand, Vaesteras (SE); Owe Rask, Vaesteras (SE)

(73) Assignee: ABB Schweiz AG, Baden (CH)

(*) Notice: Subject to any disclaimer, the term of this patent is extended or adjusted under 35 U.S.C. 154(b) by 0 days. days.

(21) Appl. No.: 15/680,240

(22) Filed: Aug. 18, 2017

(65) Prior Publication Data

US 2017/0346205 A1 Nov. 30, 2017

Related U.S. Application Data

(63) Continuation of application No. PCT/EP2016/053738, filed on Feb. 23, 2016.

(51) Int. Cl.

| | |
|---|---|
| *H01R 12/70* | (2011.01) |
| *H01R 12/72* | (2011.01) |
| *H01R 13/508* | (2006.01) |
| *H01R 13/6581* | (2011.01) |
| *H05K 1/11* | (2006.01) |

(52) U.S. Cl.
CPC ..... *H01R 12/7058* (2013.01); *H01R 12/7076* (2013.01); *H01R 12/721* (2013.01); *H01R 13/508* (2013.01); *H05K 1/117* (2013.01); *H01R 12/7088* (2013.01); *H01R 13/6581* (2013.01)

(58) Field of Classification Search
CPC .............. H01R 9/2633; H01R 12/7058; H01R 12/7076; H01R 12/7088; H01R 12/721; H01R 13/508; H01R 13/516; H01R 13/6581; H05K 1/117
USPC .......... 439/188, 716–717; 200/237–238, 271
See application file for complete search history.

(56) References Cited

U.S. PATENT DOCUMENTS 4,767,348 A * 8/1988 Murakami ....... G06K 19/07743
361/679.32
5,984,734 A * 11/1999 Piper ..................... H01R 29/00
439/715

(Continued)

FOREIGN PATENT DOCUMENTS

| DE | 19616516 C1 | 7/1997 |
|---|---|---|
| DE | 10135980 C1 | 4/2003 |

*Primary Examiner* — Edwin A. Leon
*Assistant Examiner* — Oscar Jimenez
(74) *Attorney, Agent, or Firm* — Leydig, Voit & Mayer, Ltd.

(57) ABSTRACT

A field device connection unit has a main body, on which a plurality of connection elements for connection of connecting lines to field devices and a plurality of slots each intended for receiving a respective plug-in unit are arranged. The plug-in unit has a first group of field-side plug contact devices which are connected by the connection elements for connection of connecting lines to field devices, and a second group of system-side plug contact devices which are connected to a higher-level arrangement. For testing of the field device connection unit when the field wiring is disconnected, the plug-in units have a resilient latching cam, which latches switchably in a recess in the main body, the contacts of the second group of system-side plug contact devices being closed and the contacts of the first group of field-side plug contact devices being opened.

5 Claims, 7 Drawing Sheets

(56) References Cited

U.S. PATENT DOCUMENTS

| | | | | |
|---|---|---|---|---|
| 6,062,914 A * | 5/2000 | Fasano | ............... | H01H 71/08 361/634 |
| 6,798,325 B2 * | 9/2004 | Bach | ............... | H01H 71/08 200/237 |
| 7,258,578 B2 * | 8/2007 | Kikuchi | ............... | G06K 7/0043 439/143 |
| 8,123,545 B1 | 2/2012 | Correll et al. | | |
| 2016/0360646 A1 * | 12/2016 | Eriksson | ............... | H05K 7/1468 |

* cited by examiner

MODULAR FIELD DEVICE CONNECTION UNIT

CROSS-REFERENCE TO RELATED APPLICATIONS

This application is a bypass continuation of International Application No. PCT/EP2016/053738, filed on Feb. 23, 2016, and claims benefit to German Patent Application No. DE 10 2015 002 389.6, filed on Feb. 25, 2015, the entire disclosure of each of which is hereby incorporated by reference herein. The International Application was published in German on Sep. 1, 2016, as WO 2016/135123 A1 under PCT Article 21(2).

FIELD

The invention relates to a modular field device connection unit for the electrical connection of field devices to a control component in a technical automation system.

BACKGROUND

Fundamentally, the area of application of the invention encompasses all field devices employed as technical systems in the realm of automation technology that are directly associated with a production process. Such field devices can be actuators such as control elements or valves as well as sensors such as measuring transducers in production and process automation. The field devices are connected to a superordinated control system by means of a connecting line, usually via a field bus. This is used to exchange the data which then serves for purposes of regulation, control and further processing. Communication standards that are often employed for a field bus include CAN, HART, PROFIBUS, or else they can be configured on the basis of ETHERNET, Profinet, IP.

Moreover, these field devices, especially 4-20 mA devices, but also those with a field bus, are supplied with power via this connecting line.

In actual practice, the connecting lines do not run directly from the specific field device to the control component, but rather at first individually from the specific field device to a field device connection unit that is then connected to the control component via a power line, especially a bus line. German patent specification DE 101 35 980 C1 discloses an arrangement in which field devices that are situated decentralized and close to the process are connected to a remote central system in a technical automation installation with a distributor that has at least one communication interface for the communication with the remote central system, a plurality of pluggable I/O modules and a multi-pole terminal field for the connection of field devices. The I/O modules have a system-side communication interface and a field-side communication interface located in the same plugging plane. The system-side communication interfaces of the I/O modules are connected to the communication interface in order to communicate with the central system. The field-side communication interfaces of the I/O modules and the terminal field are connected to a plug contact device at contacts that are separate from each other.

In this context, a plug-in unit which determines the configuration is provided that has a corresponding mating plug contact device which mates with a plug contact device, and conductor bridges to electrically connect contacts of the plug-in unit that are separate from each other, in such a way that, in each case, a field device is connected to the field-side communication interface of at least one I/O module. In this context, an erroneous assembly of the system with the wrong plug-in units which determine the configuration can give rise to severe errors in the field device connection unit.

Consequently, there is a need to be able to test the field device connection unit. A drawback of the prior-art field device connection unit is that the field devices are connected to the field device connection unit via field wiring. Disconnecting and re-connecting the field wiring are very labor-intensive steps, in addition to which the re-connecting is prone to errors.

SUMMARY

An aspect of the invention provides a field device connection unit, comprising: a main body on which a plurality of connection elements is arranged for the connection of connecting lines to field devices; a plurality of slots that are each configured to receive a plug-in unit, wherein the plug-in unit includes: (i) a first group of field-side plug contact devices that are connected to the connection elements for the connection of connecting lines to field devices, (ii) a second group of system-side plug contact devices that are connected to a superordinated system, (iii) a switching mechanism including first and second switching positions, a resilient latching cam, wherein the latching cam is configured to be retracted into the plug-in unit when it is in the first switching position and configured to project from the plug-in unit when it is in the second switching position, wherein the main body includes a guide for each plug-in unit, the guide including a first recess configured to receive the latching cam, wherein contacts of the second group of system-side plug contact devices are leading with respect to the contacts of the first group of field-side plug contact devices, and wherein, when the latching cam is in its latched state in the first recess, the contacts of the second group of system-side plug contact devices are closed and the contacts of the first group of field-side plug contact devices are open.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 1 a perspective view of a field device unit.

DETAILED DESCRIPTION

Before this backdrop set forth in the Background, it is the objective of the invention to put forward a field device connection unit that can be tested in its full scope and that is galvanically isolated from the field wiring during the test phase.

An aspect of the invention is based on a field device connection unit having a main body on which a plurality of connection elements is arranged for the connection of connecting lines to field devices as well as having a plurality of slots that each receive a plug-in unit. The plug-in unit has a first group of field-side plug contact devices that are connected to the connection elements for the connection of connecting lines to field devices, and it also has a second group of system-side plug contact devices that are connected to a superordinated system.

According to an aspect of the invention, the field device connection unit has the following features:
1. The plug-in unit comprises a switching mechanism with at least first and second switching positions, having a resilient latching cam, whereby the latching cam is retracted into the plug-in unit when it is in the first switching position and it projects from the plug-in unit when it is in the second switching position.
2. The main body is provided with a guide for each plug-in unit, and said guide has at least one first recess that is configured to receive the latching cam.
3. The contacts of the second group of system-side plug contact devices are leading with respect to the contacts of the first group of field-side plug contact devices.
4. When the latching cam is in its latched state in the recess, the contacts of the second group of system-side plug contact devices are closed and the contacts of the first group of field-side plug contact devices are open.

A plug-in unit having a switching mechanism in the first switching position can be plugged in and unplugged without any restrictions. When the plug-in unit is in its plugged-in state, all of the contacts of the first group of field-side plug contact devices and of the second group of system-side plug contact devices are closed. When the plug-in unit is in its unplugged state, all of the contacts of the first group of field-side plug contact devices and of the second group of system-side plug contact devices are open. The latching cam is retracted inside the plug-in unit.

A plug-in unit having a switching mechanism in the second switching position can be plugged in or unplugged, irrespective of its direction of movement along the guide, until the latching cam latches into the first recess. In this process, the latching cam slides resiliently in the guide until it reaches the first recess.

When the plug-in unit is inserted, all of the contacts of the first group of field-side plug contact devices and of the second group of system-side plug contact devices are initially open. As soon as the latching cam latches into the recess, the insertion operation is completed. When the latching cam is in its latched state in the first recess, the contacts of the second group of system-side plug contact devices are closed and the contacts of the first group of field-side plug contact devices are open.

When the plug-in unit is unplugged, all of the contacts of the first group of field-side plug contact devices and of the second group of system-side plug contact devices are initially closed. When the latching cam is in its latched state in the first recess, the contacts of the second group of system-side plug contact devices are closed and the contacts of the first group of field-side plug contact devices are open.

When the latching cam is in its latched state in the first recess, the field device connection unit can be tested on its own in its full scope while the field wiring is disconnected. System functions of the field device connection unit can be checked at the time of the start-up, irrespective of the status of the field wiring. This permits simultaneous and independent handling, especially connecting and checking the field device connections and the field wiring on the one hand, and the field device connection unit along with the superordinated system on the other hand.

Moreover, the sensitive electronic components of the field device connection unit are protected against the damaging effects of short circuits, grounding and other malfunctions in the field wiring during its installation.

Advantageously, the field devices connected to the field wiring are likewise protected against impermissible voltages from the field device connection unit.

Another advantage of the field device connection unit according to the invention can be seen in that there is no need to switch off the entire field device connection unit when one of the field devices that is supplied by the field device connection unit has to be replaced. Instead, the plug-in unit that belongs to the field device that is to be replaced merely needs to be moved into the first recess when the latching cam is in its latched state. In this state, the field wiring of this field device is disconnected from the field device connection unit; the field device is de-energized and can be safely replaced.

According to another feature of the invention, the switching mechanism is configured as a slide whose direction of movement is oriented perpendicular to the plugging direction of the plug-in unit in the plane between the guides of the main body, whereby the latching cam is configured so as to be resilient in the direction of movement of the slide.

Advantageously, this accounts for a simple and reliable guidance of the latching cam in the direction of movement of the slide.

According to another feature of the invention, the switching mechanism has a third switching position and a rigid locking cam which can be guided into a recess of the main body perpendicular to the direction of movement of the plug-in unit when the plug-in unit is completely inserted.

According to another feature of the invention, the guide of the main body has a second recess. This second recess corresponds to the rigid locking cam when the plug-in unit is completely inserted.

According to another feature of the invention, the switching mechanism has a center resting position in which the latching cam and the locking cam are retracted inside the plug-in unit. The second and third switching positions are arranged at opposite sides of the resting position in the direction of movement of the switching mechanism.

FIG. 1 show a perspective view of a field device connection unit having a main body 10 on which a plurality of connection elements 11 is arranged for the connection of connecting lines to field devices as well as a plurality of slots that each receive a plug-in unit 20. Each plug-in unit 20 is associated with a connection element 11. The connection elements 11 have screw-type terminals for the connection of connecting lines to field devices.

At every slot, the main body 10 has guides 12 into which the appertaining plug-in unit 20 is guided when it is plugged in in the plugging direction 16 and when it is unplugged counter to the plugging direction 16. Mating plug contact devices 15 arranged in the same plane are provided at every slot for purposes of field-side and system-side connection.

Figure 2:
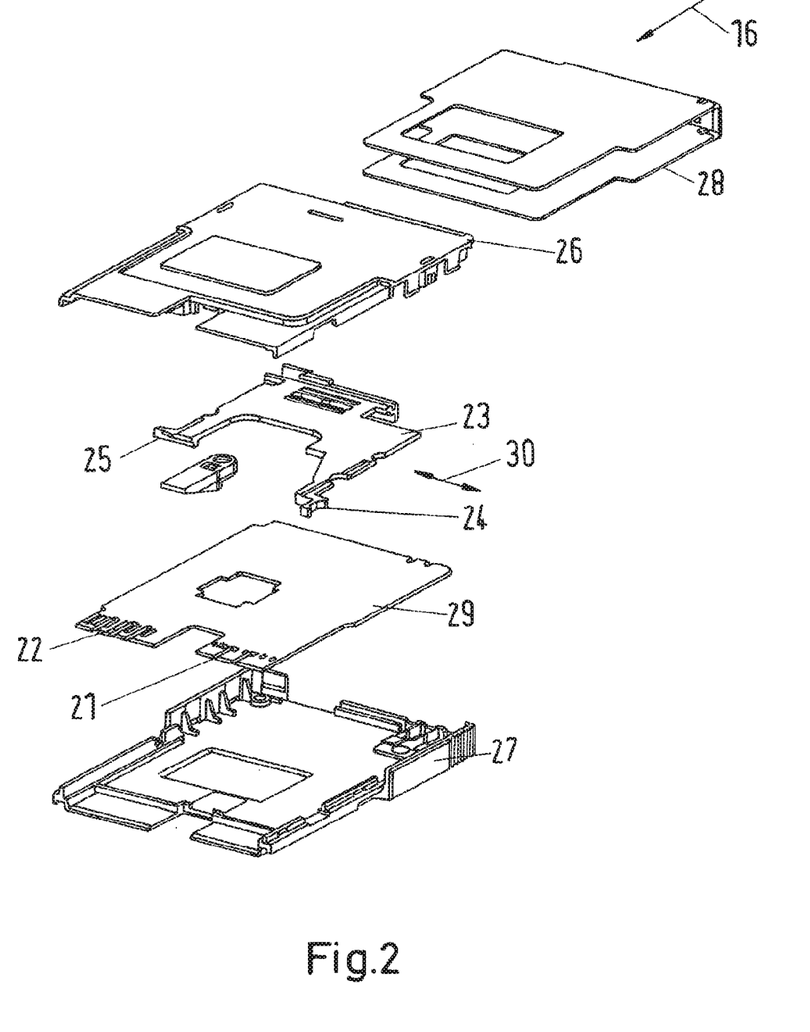
FIG. 2 an exploded view of a plug-in unit.

FIG. 2 shows a plug-in unit 20 using the same reference numerals for the same means. The plug-in unit 20 consists essentially of two housing shells 26 and 27 that match each other and that are held together by means of a clamp 28.

A printed circuit board 29 to receive functional electronic components of the plug-in unit 20 is arranged inside the plug-in unit 20. The printed circuit board 29 has a first group of field-side plug contact devices 21 which, when in the plugged-in state, are connected to the connection elements 11 for the connection of connecting lines to field devices, and it also has a second group of system-side plug contact devices 22 which, when in the plugged-in state, are connected to a superordinated system.

Moreover, the inside of the plug-in unit 20 houses a switching mechanism 23 that is configured as a slide whose direction of movement 30 is oriented perpendicular to the plugging direction 16 of the plug-in unit 20 in the plane between the guides 12 of the main body 10. The switching mechanism 23 is fitted with a resiliently configured latching cam 24 as well as with a rigid locking cam 25. The switching mechanism 23 can be actuated from the outside and it has three switching positions. The center position of the switching mechanism 23 is the resting position. The second and third switching positions are arranged at opposite sides of the resting position in the direction of movement 30 of the switching mechanism 23 and these positions will be described in greater detail below.

Figure 3:
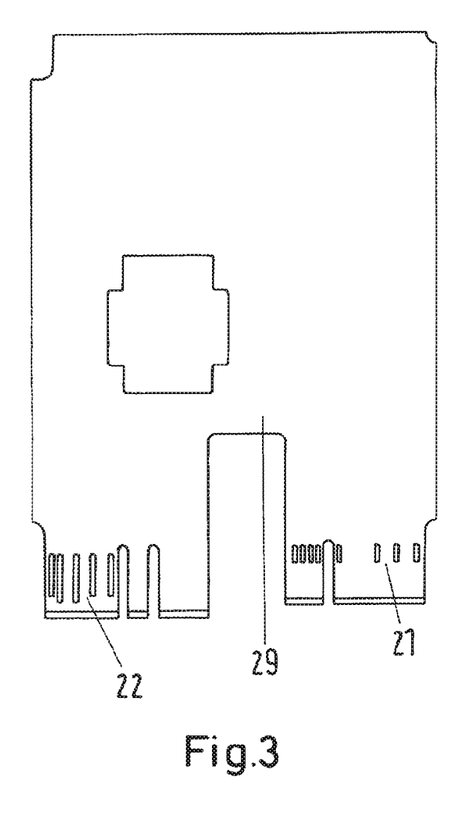
FIG. 3 a schematic diagram of a printed circuit board with leading contacts.

FIG. 3, which makes use of the same reference numerals for the same means, shows the printed circuit board 29 within the scope of the means that are essential for the invention. The printed circuit board 29 has groups of contact surfaces which form the field-side plug contact devices 21 and the system-side plug contact devices 22. The contact surfaces of the second group of system-side plug contact devices 22 are longer than the contact surfaces of the first group of field-side plug contact devices 21, and they run closer to the edge of the printed circuit board 29 on the main body side. In the case of field-side and system-side mating plug contact devices 15, the contacts of the second group of system-side plug contact devices 22 are leading with respect to the contacts of the first group of field-side plug contact devices 21.

Figure 4A:
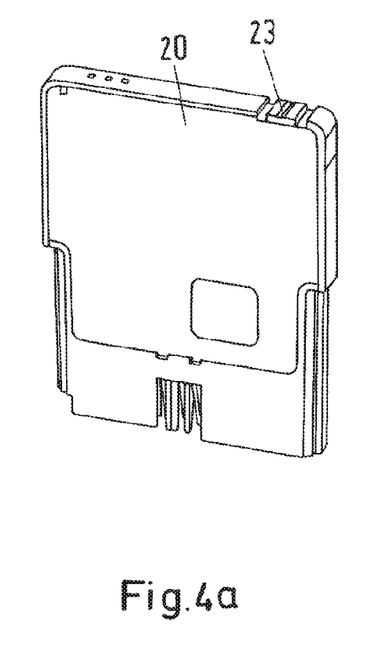
FIG. 4a-b a perspective view and a sectional view of a plug-in unit with a switching mechanism in the resting position.
Figure 4B:
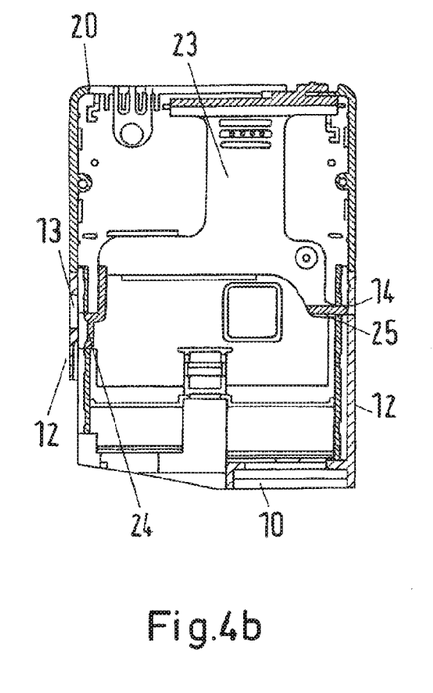

Using the same reference numerals for the same means, FIG. 4 shows a perspective view and a sectional view of the plug-in unit 20 with a switching mechanism 23 in the resting position. The switching mechanism 23 is in the center position. The latching cam 24 and the locking cam 25 are retracted inside the plug-in unit 20. When the switching mechanism 23 is in this resting position, the plug-in unit 20 can be completely unplugged from the main body 10 or completely unplugged from the main body 10.

The sectional view of FIG. 4b shows the plug-in unit 20 in its completely plugged-in state into the main body 10. The guides 12 of the main body 10 have a first recess 13 and a second recess 14. The recesses 13 and 14 are arranged in opposite guides 12. The second recess 14 is arranged so as to match the latching cam 25. For purposes of locking the plug-in unit 20 in its completely plugged-in state, the switching mechanism 23, and thus the locking cam 25, is moved in the direction of the second recess 14 into the third switching position. In this manner, the plug-in unit 20 is locked in the main body 10. Moreover, the field-side plug contact devices 21 and the system-side plug contact devices 22 are completely in electrical contact with the corresponding mating plug contact devices 15.

Figure 5A:
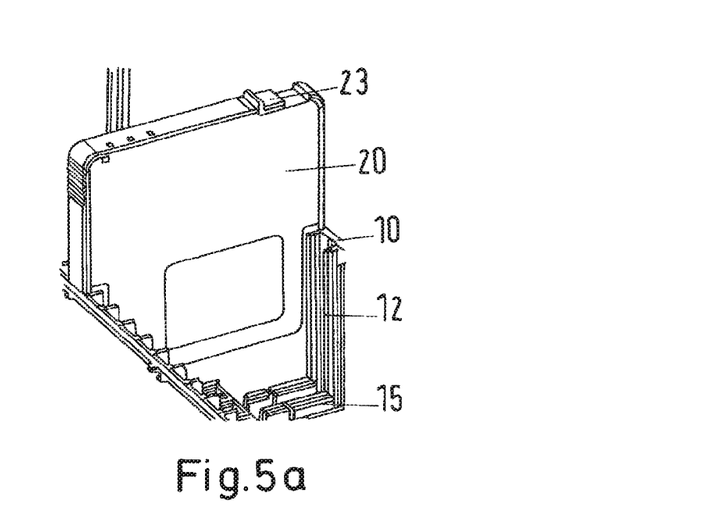
FIG. 5a-b a perspective view and a sectional view of a plug-in unit in its completely plugged-in state.
Figure 5B:
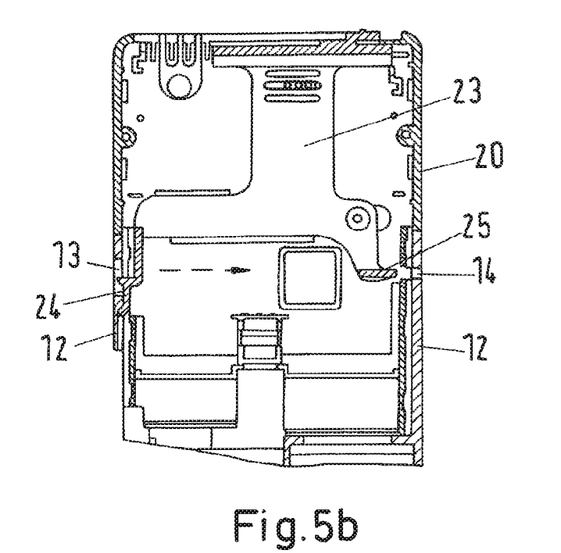

Using the same reference numerals for the same means, FIG. 5 shows a perspective view and a sectional view of the plug-in unit 20 in its completely plugged-in state, whereby the switching mechanism 23 is depicted in the second switching position. In this second switching position, the locking cam 25 is retracted far inside the plug-in unit 20. The latching cam 24 is resiliently pre-tensioned inside the plug-in unit 20.

When the plug-in unit 20 is being unplugged, the latching cam 24 slides in the guide 12 of the main body 10 until it reaches the first recess 13 and latches into the first recess 13.

Figure 6A:
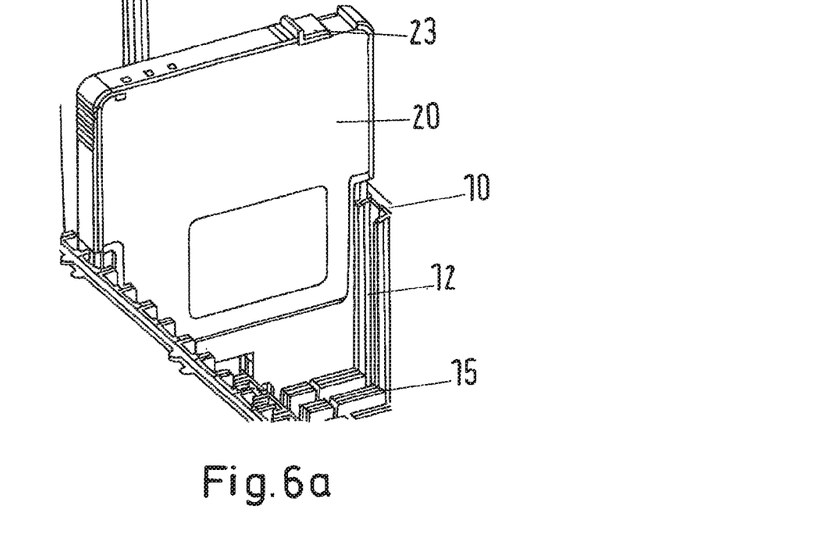
FIG. 6a-b a perspective view and a sectional view of a plug-in unit in its partially unplugged, latched state.
Figure 6B:
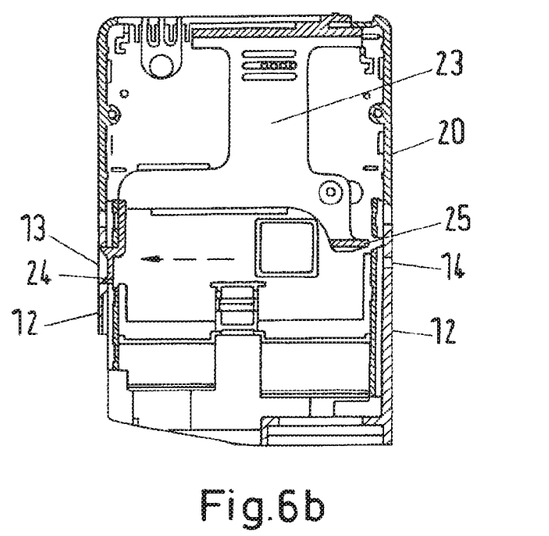

Using the same reference numerals for the same means, FIG. 6 shows a perspective view and a sectional view of the plug-in unit 20 in its partially unplugged, latched state. This state is reached when the plug-in unit 20 is being plugged in as well as when it is being unplugged, provided that the switching mechanism 23 is in the second switching position.

The resilient latching cam 24 is latched in the first recess 13. The field-side plug contact devices 21 are disconnected from the corresponding mating plug contact devices 15, whereas the system-side plug contact devices 22 are electrically connected to the corresponding mating plug contact devices 15.

In order to leave the latched state, the switching mechanism 23 has to be moved into the neutral resting position according to the description given above pertaining to FIG. 4.

Figure 7:
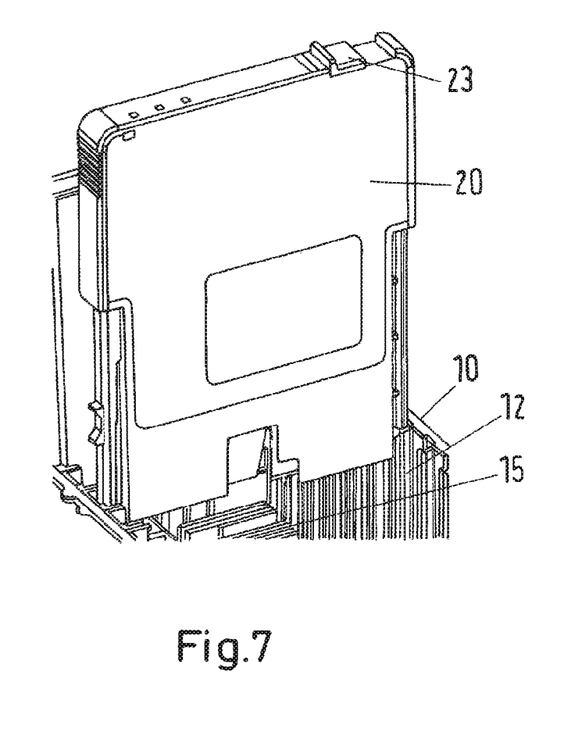
FIG. 7 a perspective view of a plug-in unit in its unplugged state.

Using the same reference numerals for the same means, FIG. 7 shows a perspective view and a sectional view of the plug-in unit 20 in its unplugged state, whereby the switching mechanism 23 is depicted in the second switching position. The latching cam 24 projects over and beyond the outer contour of the plug-in unit 20. All of the electric plug contact devices of the plug-in unit 20 are disconnected from the corresponding mating plug contact devices 15.

When the plug-in unit 20 is being plugged in, the latching cam 24 slides in the guide 12 of the main body 10 until it reaches the first recess 13 and latches into the first recess 13. In this manner, the plugged-in state of the plug-in unit 20 is reached according to the above-mentioned description pertaining to FIG. 6.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B, and C, and should not be interpreted as requiring at least one of each of the listed elements A, B, and C, regardless of whether A, B, and C are related as categories or otherwise. Moreover, the recitation of "A, B, and/or C" or "at least one of A, B, or C" should be interpreted as including any singular entity from the listed elements, e.g., A, any subset from the listed elements, e.g., A and B, or the entire list of elements A, B, and C.

REFERENCE NUMERALS 10 main body
11 connection element
12 guide
13,14 recess
15 mating plug contact device
16 plugging direction
20 plug-in unit
21 field-side plug contact device
22 system-side plug contact device
23 switching mechanism
24 latching cam
25 locking cam
26, 27 housing shell
28 clamp
29 printed circuit board
30 direction of movement

The invention claimed is:

1. A field device connection unit, comprising:
a main body on which a plurality of connection elements is arranged for the connection of connecting lines to field devices;
a plurality of slots that are each configured to receive a plug-in unit,
wherein the plug-in unit includes: (i) a first group of field-side plug contact devices that are connected to the connection elements for the connection of connecting lines to field devices, (ii) a second group of system-side plug contact devices that are connected to a superordinated system, (iii) a switching mechanism including first and second switching positions, a resilient latching cam,
wherein the latching cam is configured to be retracted into the plug-in unit when it is in the first switching position and configured to project from the plug-in unit when it is in the second switching position,
wherein the main body includes a guide for each plug-in unit, the guide including a first recess configured to receive the latching cam,
wherein contacts of the second group of system-side plug contact devices are leading with respect to the contacts of the first group of field-side plug contact devices, and
wherein, when the latching cam is in its latched state in the first recess, the contacts of the second group of system-side plug contact devices are closed and the contacts of the first group of field-side plug contact devices are open.

2. The unit of claim 1, wherein the switching mechanism is configured as a slide whose direction of movement is oriented perpendicular to a plugging direction of the plug-in unit in a plane between the guides of the main body,
wherein the latching cam is configured so as to be resilient in the direction of movement of the slide.

3. The unit of claim 1, wherein the switching mechanism includes a third switching position and a rigid locking cam which can be guided into a recess of the main body perpendicular to a direction of movement of the plug-in unit when the plug-in unit is completely inserted.

4. The unit of claim 3, wherein the guide of the main body includes a second recess that corresponds to the rigid locking cam when the plug-in unit is completely inserted.

5. The unit of claim 1, wherein the switching mechanism includes a center resting position in which the latching cam and the locking cam are configured to be retracted inside the plug-in unit.

* * * * *